US009576964B2

(12) United States Patent
Chan et al.

(10) Patent No.: US 9,576,964 B2
(45) Date of Patent: Feb. 21, 2017

(54) INTEGRATED FIN AND STRAP STRUCTURE FOR AN ACCESS TRANSISTOR OF A TRENCH CAPACITOR

(71) Applicant: International Business Machines Corporation, Armonk, NY (US)

(72) Inventors: Kevin K. Chan, Staten Island, NY (US); Babar A. Khan, Ossining, NY (US); Dae-Gyu Park, Poughquaq, NY (US); Xinhui Wang, Poughkeepsie, NY (US)

(73) Assignee: INTERNATIONAL BUSINESSS MACHINES CORPORATION, Armonk, NY (US)

( * ) Notice: Subject to any disclaimer, the term of this patent is extended or adjusted under 35 U.S.C. 154(b) by 152 days.

(21) Appl. No.: 13/857,282

(22) Filed: Apr. 5, 2013

(65) Prior Publication Data
US 2014/0299882 A1  Oct. 9, 2014

(51) Int. Cl.
*H01L 27/108* (2006.01)
*H01L 29/94* (2006.01)
*H01L 29/66* (2006.01)
*H01L 27/12* (2006.01)
*H01L 49/02* (2006.01)
(Continued)

(52) U.S. Cl.
CPC ..... *H01L 27/10867* (2013.01); *H01L 27/1085* (2013.01); *H01L 27/10829* (2013.01); *H01L 27/10855* (2013.01); *H01L 27/10861* (2013.01); *H01L 27/10879* (2013.01); *H01L 27/1211* (2013.01); *H01L 28/40* (2013.01); *H01L 29/04* (2013.01); *H01L 29/0657* (2013.01); *H01L 29/1033* (2013.01); *H01L 29/66181* (2013.01);*H01L 29/66795* (2013.01); *H01L 29/945* (2013.01)

(58) Field of Classification Search
CPC ........... H01L 27/0629; H01L 27/10805; H01L 27/10829; H01L 27/1085; H01L 27/10855; H01L 27/10861; H01L 27/10867

USPC ............ 257/68, 71, 296, E27.092, E21.649, 257/E21.653; 438/239, 243
See application file for complete search history.

(56) References Cited

U.S. PATENT DOCUMENTS 5,923,971 A    7/1999  Ho et al.
6,222,218 B1 *  4/2001  Jammy et al. ................ 257/301
(Continued)

OTHER PUBLICATIONS

U.S. Office Action dated Apr. 8, 2016 received in U.S. Appl. No. 14/874,392.

*Primary Examiner* — Eduardo A Rodela
*Assistant Examiner* — Christopher M Roland
(74) *Attorney, Agent, or Firm* — Scully, Scott, Murphy & Presser, P.C.; Steven J. Meyers

(57) ABSTRACT

At least one dielectric pad layer is formed on a semiconductor-on-insulator (SOI) substrate. A deep trench is formed in the SOI substrate, and a combination of an outer electrode, a node dielectric, and an inner electrode are formed such that the top surface of the inner electrode is recessed below the top surface of a buried insulator layer of the SOI substrate. Selective epitaxy is performed to fill a cavity overlying the inner electrode with an epitaxial semiconductor material portion. A top semiconductor material layer and the epitaxial semiconductor material portion are patterned to form a fin structure including a portion of the top semiconductor material layer and a portion of the epitaxial semiconductor material portion. The epitaxial semiconductor material portion functions as a conductive strap structure between the inner electrode and a semiconductor device to be formed on the fin structure.

14 Claims, 17 Drawing Sheets

(51) Int. Cl.
    *H01L 29/04*    (2006.01)
    *H01L 29/06*    (2006.01)
    *H01L 29/10*    (2006.01)

(56) References Cited

U.S. PATENT DOCUMENTS

| | | | |
|---|---|---|---|
| 6,340,615 B1 * | 1/2002 | Iyer | H01L 27/10867 |
| | | | 257/E21.653 |
| 6,482,717 B1 | 11/2002 | Hahn | |
| 6,660,581 B1 | 12/2003 | Yang et al. | |
| 6,872,620 B2 | 3/2005 | Chidambarrao et al. | |
| 7,064,039 B2 | 6/2006 | Liu | |
| 7,354,826 B1 | 4/2008 | Orimoto et al. | |
| 7,655,985 B2 | 2/2010 | Furukawa et al. | |
| 7,741,188 B2 | 6/2010 | Dyer et al. | |
| 8,008,138 B2 | 8/2011 | Cheng et al. | |
| 8,367,485 B2 | 2/2013 | Chang et al. | |
| 2009/0008691 A1 * | 1/2009 | Lee | H01L 29/66621 |
| | | | 257/301 |
| 2009/0230471 A1 * | 9/2009 | Li | H01L 21/32137 |
| | | | 257/347 |
| 2009/0256185 A1 * | 10/2009 | Cheng et al. | 257/301 |
| 2009/0289291 A1 * | 11/2009 | Cheng | H01L 21/84 |
| | | | 257/301 |
| 2011/0227157 A1 | 9/2011 | Yang et al. | |
| 2011/0248326 A1 | 10/2011 | Kanakasabapathy et al. | |
| 2011/0272762 A1 * | 11/2011 | Booth, Jr. | H01L 21/84 |
| | | | 257/347 |
| 2012/0273879 A1 | 11/2012 | Mallikarjunaswamy et al. | |
| 2012/0280251 A1 | 11/2012 | Dube et al. | |
| 2012/0299062 A1 | 11/2012 | Chang et al. | |

* cited by examiner

INTEGRATED FIN AND STRAP STRUCTURE FOR AN ACCESS TRANSISTOR OF A TRENCH CAPACITOR

BACKGROUND

The present disclosure relates to a semiconductor structure, and particularly to an epitaxial strap structure between a fin field effect transistor (FET) and a trench capacitor, and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

As dimensions of semiconductor devices scale, providing a robust low resistance path for electrical conduction between an inner electrode of a transistor and the source of an access transistor becomes a challenge because available area for forming a conductive strap structure decreases. Conventional processes for forming a conductive strap structure as known in the art introduces additional complexity when such a conductive strap structure needs to be formed between the inner electrode and a three-dimensional field effect transistor such as a fin field effect transistor (finFET).

BRIEF SUMMARY

At least one dielectric pad layer is formed on a semiconductor-on-insulator (SOI) substrate. A deep trench is formed in the SOI substrate, and a combination of an outer electrode, a node dielectric, and an inner electrode are formed such that the top surface of the inner electrode is recessed below the top surface of a buried insulator layer of the SOI substrate. Selective epitaxy is performed to fill a cavity overlying the inner electrode with an epitaxial semiconductor material portion. A top semiconductor material layer and the epitaxial semiconductor material portion are patterned to form a fin structure including a portion of the top semiconductor material layer and a portion of the epitaxial semiconductor material portion. The epitaxial semiconductor material portion functions as a conductive strap structure between the inner electrode and a semiconductor device to be formed on the fin structure.

According to an aspect of the present disclosure, a semiconductor structure includes a trench capacitor embedded in a stack of a semiconductor substrate and an insulator layer. The trench capacitor includes an inner electrode, a node dielectric, and an outer electrode. The semiconductor structure further includes an integrated fin and strap structure located on the insulator layer. The integrated fin and strap structure includes a semiconductor fin and an epitaxial semiconductor strap structure. The epitaxial semiconductor strap structure is epitaxially aligned to the semiconductor fin and extends below a top surface of the insulator layer.

According to another aspect of the present disclosure, a method of forming a semiconductor structure is provided. At least one pad layer is formed on a top semiconductor layer of a semiconductor-on-insulator (SOI) substrate. A trench extending below a bottom surface of an insulator layer is formed within the SOI substrate. A trench capacitor including an inner electrode, a node dielectric, and an outer electrode is formed in the SOI substrate. An epitaxial semiconductor pillar structure is formed on a sidewall of the top semiconductor layer in a portion of the trench over the inner electrode. An integrated fin and strap structure is formed by simultaneously etching the top semiconductor layer and the epitaxial semiconductor pillar structure.

DETAILED DESCRIPTION

Figure 1A:
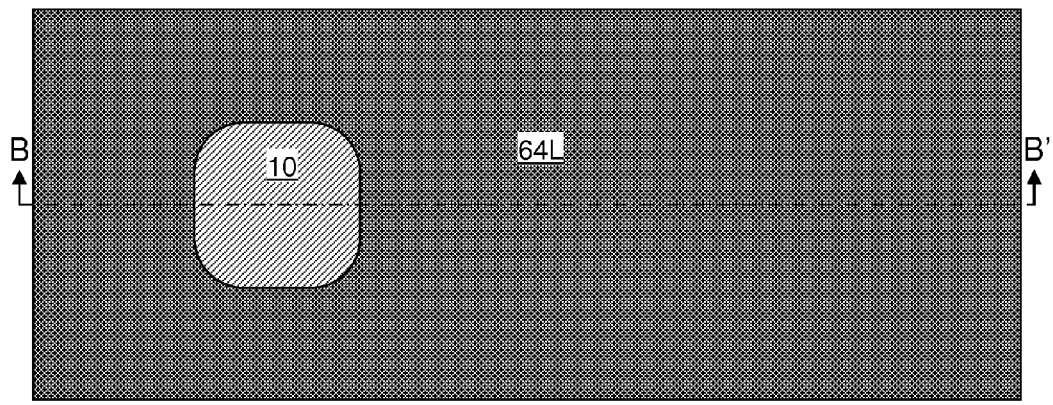
FIG. 1A is a top-down view of a first exemplary semiconductor structure after formation of at least one pad layer and formation of a deep trench through a semiconductor-on-insulator (SOI) substrate according to an embodiment of the present disclosure.

As stated above, the present disclosure relates to an epitaxial strap structure between a fin field effect transistor (FET) and a trench capacitor, and a method of manufacturing the same. The aspects of the present disclosure are now described in detail with accompanying figures. It is noted that like reference numerals refer to like elements across different embodiments. The drawings are not necessarily drawn to scale. Ordinals are used merely to distinguish among similar elements, and different ordinals may be employed across the specification and the claims of the instant application.

Figure 1B:
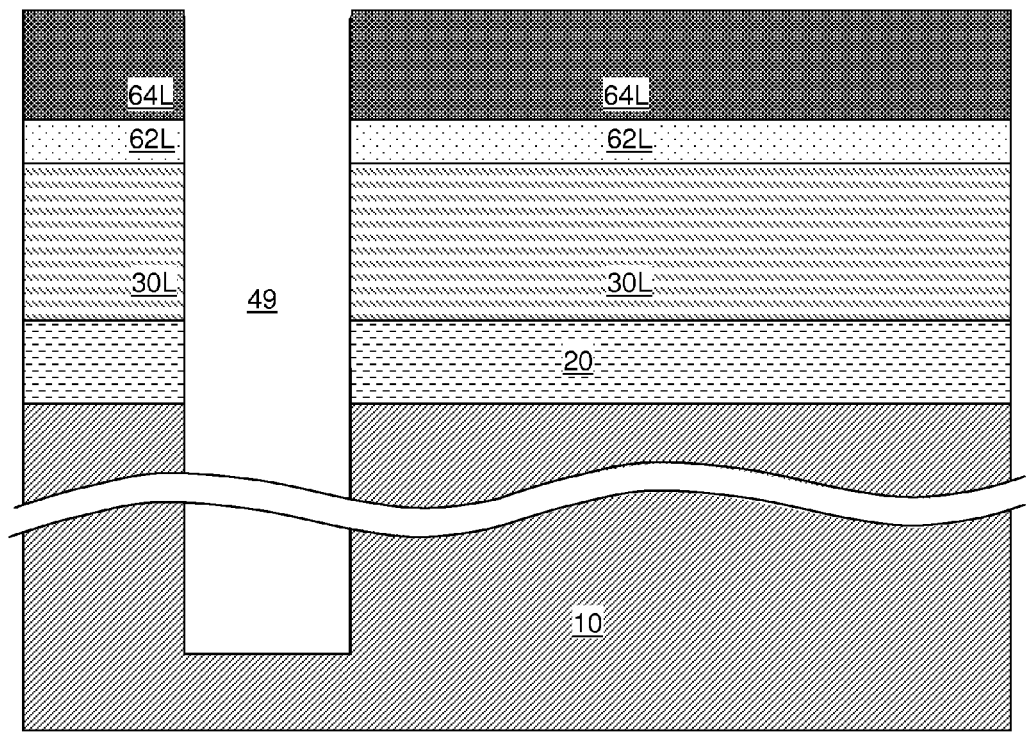
FIG. 1B is a vertical cross-sectional view of the first exemplary semiconductor structure along the vertical plane B-B' of FIG. 1A.

Referring to FIGS. 1A and 1B, a first exemplary semiconductor structure according to a embodiment of the present disclosure includes a semiconductor-on-insulator (SOI) substrate. The SOI substrate includes a stack, from bottom to top, of a bottom semiconductor layer 10, a buried insulator layer 20, and a top semiconductor layer 30L.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 50 nm to 1,000 nm, and the thickness of the bottom semiconductor layer 10 can be from 50 microns to 2 mm, although lesser and greater thicknesses can also be employed for each of these layers (10, 20, 30L).

At least one pad layer can be deposited on the SOI substrate (10, 20, 30L), for example, by chemical vapor deposition (CVD) or atomic layer deposition (ALD). The at least one pad layer can include one or more layers that can be employed as an etch mask for forming a deep trench 49 in the SOI substrate (10, 20, 30L). As used herein, a "deep trench" refers to a trench that extends from a topmost surface of a semiconductor-on-insulator (SOI) substrate through a top semiconductor layer and a buried insulator layer and partly into an underlying semiconductor layer.

In one embodiment, each of the at least one pad layer can include a dielectric material such as silicon nitride, a dielectric metal nitride, a doped silicon undoped silicon oxide, or a dielectric metal oxide. The total thickness of the at least one pad layer can be from 100 nm to 2,000 nm, although lesser and greater thicknesses can also be employed.

In one embodiment, the at least one pad layer includes a stack of a lower pad layer 62L and an upper pad layer 64L. The lower pad layer 62L includes a first dielectric material, and the upper pad layer 64L includes a second dielectric material that is different from the first dielectric material. In one embodiment, the lower pad layer 62L can include silicon oxide, and the upper pad layer 64L can include silicon nitride. In one embodiment, the thickness of the lower pad layer 62L can be from 10 nm to 100 nm, and the thickness of the upper pad layer 64L can be from 40 nm to 360 nm, although lesser and greater thicknesses can also be employed for each of the lower pad layer 62L and the upper pad layer 64L.

A photoresist layer (not shown) can be applied over the at least one pad layer (62L, 64L) and can be lithographically patterned to form at least one opening having an area of a deep trench 49 to be subsequently formed. The pattern in the photoresist layer can be transferred into the at least one pad layer (62L, 64L). Subsequently, the pattern in the at least one pad layer (62L, 64L) can be transferred through the top semiconductor layer 30L, the buried insulator layer 20, and an upper portion of the bottom semiconductor layer 10 by an anisotropic etch that employs the at least one pad layer (62L, 64L) as an etch mask. A deep trench 49 can be formed for each opening in the at least one pad layer (62L, 64L). The photoresist can be removed by ashing, or can be consumed during the etch process that forms the deep trench 49.

The sidewalls of the deep trench 49 can be substantially vertically coincident among the various layers (64L, 62L, 30L, 20, 10) through which the deep trench 49 extends. As used herein, sidewalls of multiple elements are "vertically coincident" if the sidewalls of the multiple elements overlap in a top-down view such as FIG. 1A. As used herein, sidewalls of multiple elements are "substantially vertically coincident" if the lateral offset of the sidewalls of the multiple elements from a perfectly vertical surface is within 5 nm. The depth of the deep trench 49 as measured from the plane of the topmost surface of the SOI substrate (10, 20, 30L) to the bottom surface of the deep trench 49 can be from 500 nm to 10 microns, although lesser and greater depths can also be employed. The lateral dimensions of the deep trench 49 can be limited by the lithographic capabilities, i.e., the ability of a lithographic tool to print the image of an opening on the photoresist layer. In one embodiment, the "width," i.e., a sidewall to sidewall distance, of the deep trench along the direction parallel to the B-B' plane and along the direction perpendicular to the B-B' plane can be from 32 nm to 150 nm, although lesser dimensions can be employed with availability of lithographic tools capable of printing smaller dimensions in the future.

Figure 2A:
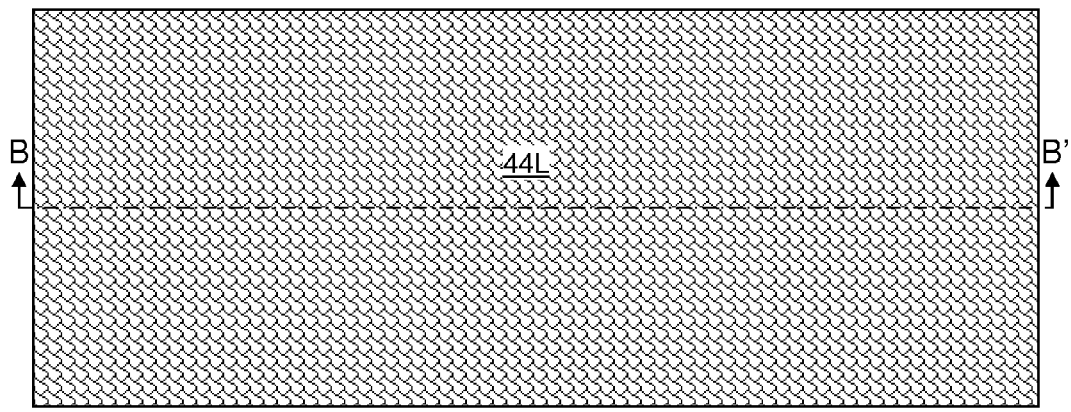
FIG. 2A is a top-down view of the first exemplary semiconductor structure after formation of a node dielectric layer and an inner electrode layer in the deep trench according to an embodiment of the present disclosure.
Figure 2B:
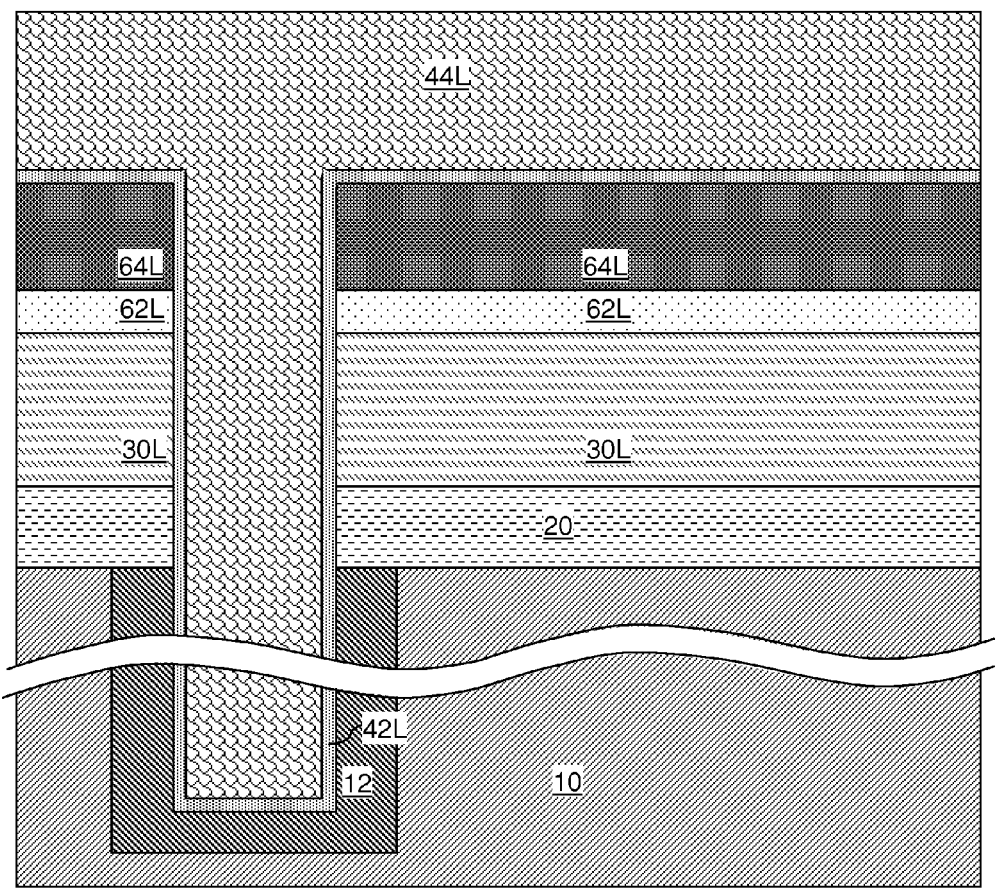
FIG. 2B is a vertical cross-sectional view of the first exemplary semiconductor structure along the vertical plane B-B' of FIG. 2A.

Referring to FIGS. 2A and 2B, a buried plate 12 can be formed by doping a portion of the bottom semiconductor layer 12 in proximity of sidewalls of the bottom semiconductor layer 10 within each deep trench 49. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of an SOI substrate (10, 20, 30L) can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric layer 42L can be deposited conformally on all physically exposed sidewalls in the deep trench 42L and on the top surface of the upper pad layer 64L. The node dielectric layer 42L can include any dielectric material that can be employed as a node dielectric material in a capacitor known in the art. For example, the node dielectric layer 42L can include at least one of silicon nitride and a dielectric metal oxide material such as high dielectric constant (high-k) gate dielectric material as known in the art.

An inner electrode layer 44L can be deposited to completely fill the deep trench 49. The inner electrode layer 44L includes a conductive material, which can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode layer 44L can be deposited by physical vapor deposition (PVD), chemical vapor deposition (CVD), electroplating, electroless plating, or a combination thereof. The inner electrode layer 44L is deposited to a thickness that is sufficient to completely fill the deep trench 49.

Figure 3A:
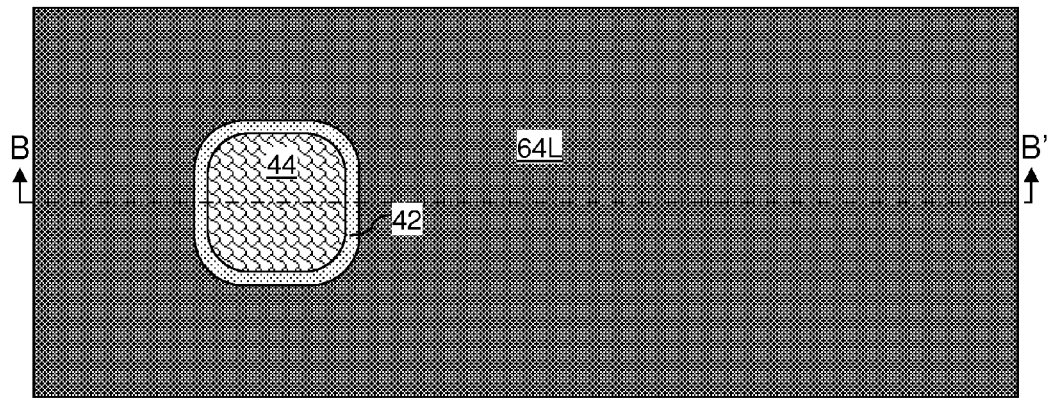
FIG. 3A is a top-down view of the first exemplary semiconductor structure after recessing the inner electrode layer and removal of exposed portions of the node dielectric layer according to an embodiment of the present disclosure.
Figure 3B:
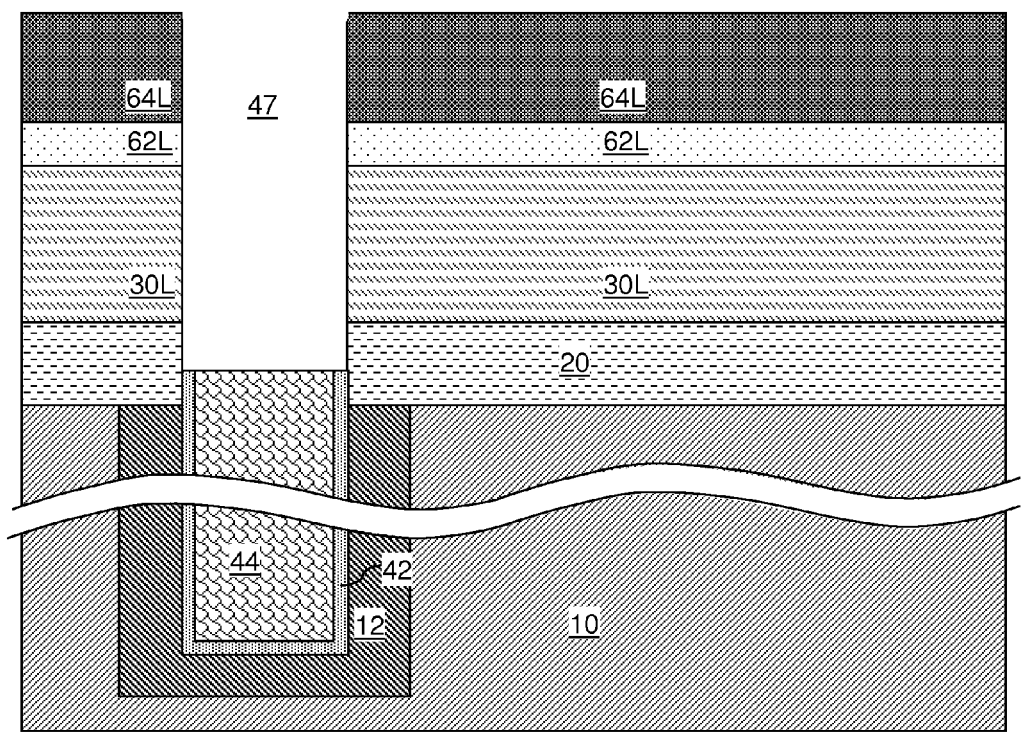
FIG. 3B is a vertical cross-sectional view of the first exemplary semiconductor structure along the vertical plane B-B' of FIG. 3A.

Referring to FIGS. 3A and 3B, the inner electrode layer 44L can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric layer 42L.

An inner electrode 44 including the conductive material of the inner electrode layer 44L is formed in the deep trench 49. The topmost surface of the inner electrode 44 is substantially planar, and is located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A cavity 47 is formed above the inner electrode 44.

The physically exposed portions of the node dielectric layer 42L can be patterned by an etch, which can be a wet etch. For example, if the node dielectric layer 42L includes silicon nitride, the physically exposed portions of the node dielectric layer 42L can be removed by a wet etch employing hot phosphoric acid. The remaining portion of the node dielectric layer 42L within the deep trench 49 constitutes a node dielectric 42. The set of the buried plate 12, the node dielectric 42, and the inner electrode 44 constitute a trench capacitor (12, 42, 44). The buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the SOI substrate (10, 12, 20, 30L). The buried insulator layer 20 overlies the buried plate 12 (i.e., the outer electrode).

Figure 4A:
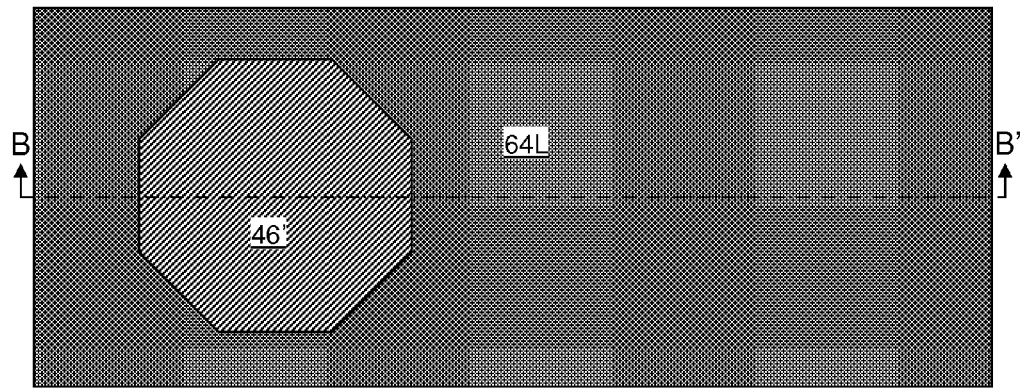
FIG. 4A is a top-down view of the first exemplary semiconductor structure after formation of an epitaxial semiconductor pillar structure and a polycrystalline semiconductor material portion according to an embodiment of the present disclosure.
Figure 4B:
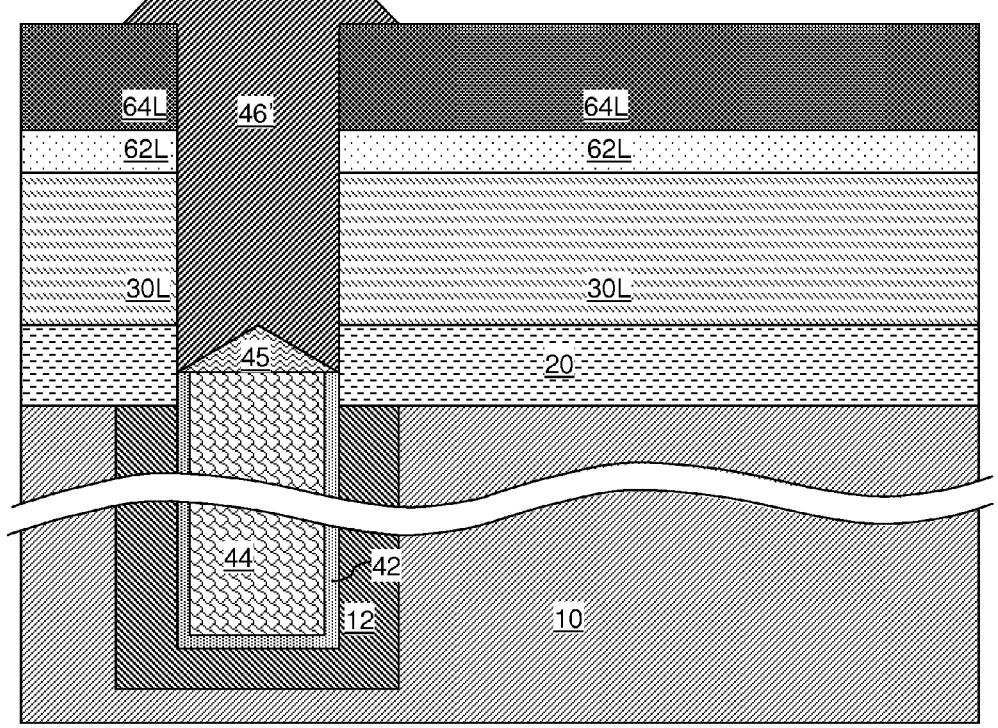
FIG. 4B is a vertical cross-sectional view of the first exemplary semiconductor structure along the vertical plane B-B' of FIG. 4A.

Referring to FIGS. 4A and 4B, a semiconductor material is deposited on semiconductor surfaces by a selective deposition process. The selective deposition process employs simultaneous or concurrent flow of a reactant gas and an etchant gas. The reactant gas is a precursor gas for deposition of a semiconductor material. For example, the reactant gas can be $SiH_4$, $SiH_2Cl_2$, $SiHCl_3$, $SiCl_4$, $Si_2H_6$, $GeH_4$, $Ge_2H_6$, or any other precursor gas for depositing an elemental semiconductor material or a compound semiconductor material as known in the art. The etchant gas can be, for example, HCl or any other etchant gas compatible with simultaneous or concurrent flow of the reactant gas. In one embodiment, the selective deposition process can be a selective epitaxy process that is performed at an elevated temperature that enables epitaxial alignment of a deposited semiconductor material with an underlying semiconductor material.

During the selective deposition process, a semiconductor material nucleates, and grows on, semiconductor surfaces, while the semiconductor material does not nucleate on, or grow from, dielectric surfaces. Thus, the semiconductor material grows from the sidewall surfaces of the top semiconductor layer 30L. If the inner electrode 44 includes a semiconductor material such as doped polysilicon, the semiconductor material can grow from the top surface of the inner electrode 44.

In one embodiment, selective epitaxy of a semiconductor material can be employed for the selective deposition process. A single crystalline semiconductor material can grow on sidewalls of the top semiconductor layer 30L in a portion of the trench over the inner electrode 44 to form an epitaxial semiconductor pillar structure 46'. The epitaxial semiconductor pillar structure 46' is formed in epitaxial alignment with a single crystalline semiconductor material of the top semiconductor layer 30L. The epitaxial semiconductor pillar structure 46' overlies the inner electrode 44.

In addition, a polycrystalline semiconductor material portion 45 can grow from the inner electrode simultaneously with the growth of the epitaxial semiconductor pillar structure 46' from the sidewalls of the top semiconductor layer 30L. Thus, the polycrystalline semiconductor material portion 45 can be formed directly on the top surface of the inner electrode 44 simultaneously with formation of the epitaxial semiconductor pillar structure 46'.

During the simultaneous growth of the epitaxial semiconductor pillar structure 46' and the polycrystalline semiconductor material portion 45, surfaces of the epitaxial semiconductor pillar structure 46' come in contact with surfaces of the polycrystalline semiconductor material portion 45 to define a boundary between the epitaxial semiconductor pillar structure 46' and the polycrystalline semiconductor material portion 45. As the lateral growth of the epitaxial semiconductor pillar structure 46' toward a center axis of the trench proceeds, the volume into which the growth of the polycrystalline semiconductor material portion 45 can proceed is reduced. Once the lateral growth of the epitaxial semiconductor pillar structure 46' reaches the center axis of the trench, all upper surfaces of the polycrystalline semiconductor material portion 45 contacts surfaces of the epitaxial semiconductor pillar structure 46', and the epitaxial semiconductor pillar structure 46' prevents further growth of the polycrystalline semiconductor material portion 45.

After the growth of the polycrystalline semiconductor material portion 45 stops, the epitaxial semiconductor pillar structure 46' can continue to grow upward up to the topmost surface of the at least one pad layer (62L, 64L), and subsequently, above the topmost surface of the at least one pad layer (62L, 64L). Crystallographic facets may be formed on the epitaxial semiconductor pillar structure 46' above the horizontal plane of the topmost surface of the at least one pad layer (62L, 64L).

The polycrystalline semiconductor material portion 45 can be formed with a horizontal cross-sectional area that decreases with a vertical distance from an interface between the inner electrode 44 and the polycrystalline semiconductor material portion 45. The polycrystalline semiconductor material portion 45 can be in contact with the top surface of the inner electrode 44 and a non-planar bottom surface of the epitaxial semiconductor pillar structure 46'.

The composition of the epitaxial semiconductor pillar structure 46' may be the same as, or may be different from, the composition of the top semiconductor layer 30L. In one embodiment, the semiconductor material of the epitaxial semiconductor pillar structure 46' may be the same as, or may be different from, the semiconductor material of the top semiconductor layer 30L. As used herein, a semiconductor material of an element refers to the semiconductor material component of the element excluding electrical dopants. As used herein, electrical dopants refer to p-type dopants or n-type dopants. In one embodiment, the semiconductor material of the epitaxial semiconductor pillar structure 46' can be the same as, or may be different from, the semiconductor material of the top semiconductor layer 30L, and includes dopants of different types of different species than dopants of the top semiconductor layer 30L. For example, the top semiconductor layer 30L can have a p-type doping and the epitaxial semiconductor pillar structure 46' can have an n-type doping, or vice versa. In another example, the dopant species in the top semiconductor layer 30L may be the same as, or different from, the dopant species of the epitaxial semiconductor pillar structure 46'. In yet another example, the dopant concentration in the top semiconductor layer 30L may be the same as, or different from, the dopant concentration of the epitaxial semiconductor pillar structure 46'.

In one embodiment, the epitaxial semiconductor pillar structure 46' and the polycrystalline semiconductor material portion 45 can be formed with in-situ doping of p-type dopants or n-type dopants. In one embodiment, the conductivity type of the epitaxial semiconductor pillar structure 46' and the polycrystalline semiconductor material portion 45 can be the opposite of the conductivity type of the top semiconductor layer 30L. For example, if the top semiconductor layer 30L has p-type doping, the epitaxial semiconductor pillar structure 46' and the polycrystalline semiconductor material portion 45 as n-type doping, and vice versa.

Figure 5A:
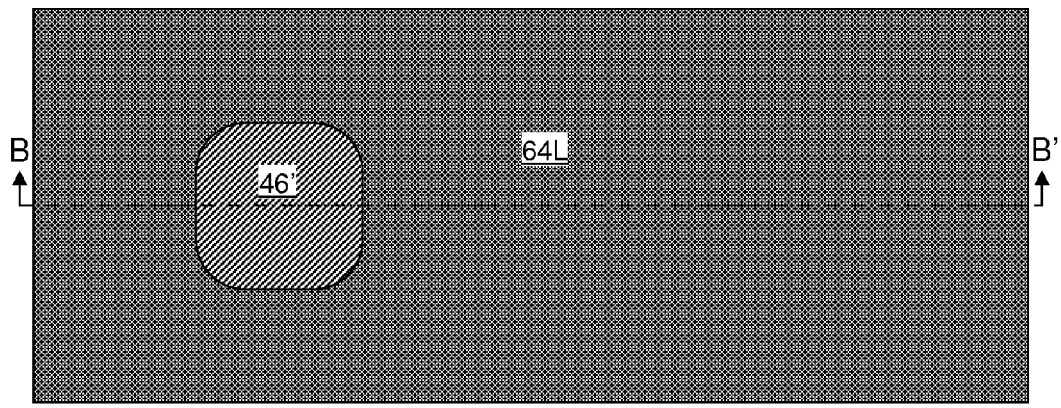
FIG. 5A is a top-down view of the first exemplary semiconductor structure after recessing of the epitaxial semiconductor pillar structure according to an embodiment of the present disclosure.
Figure 5B:
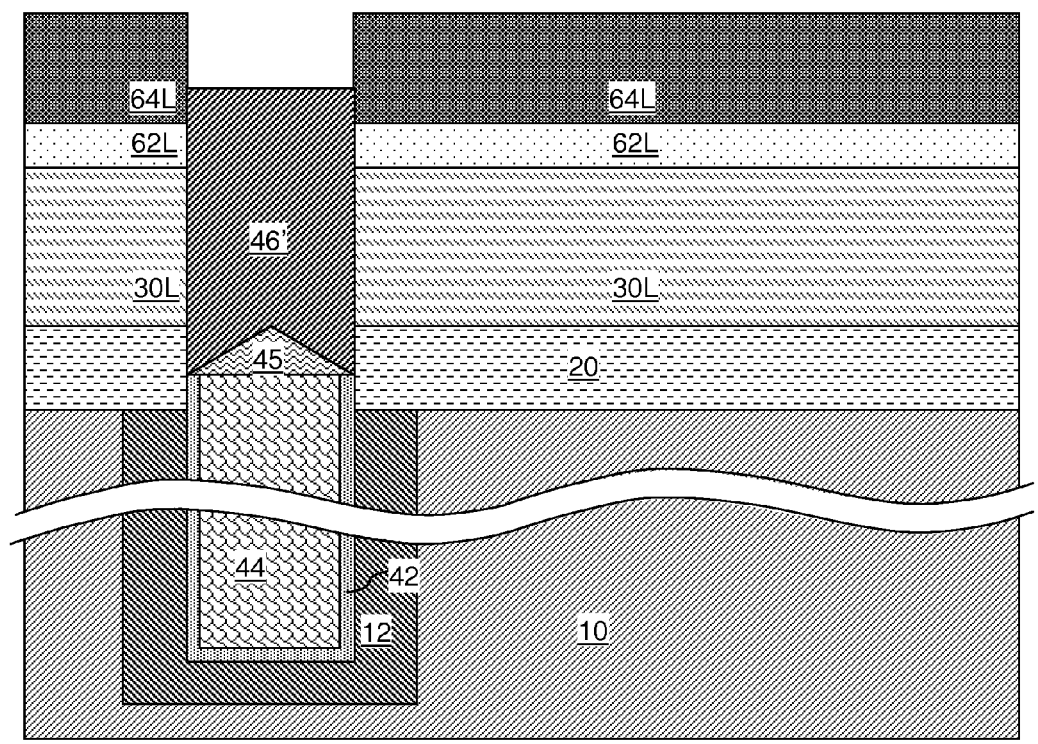
FIG. 5B is a vertical cross-sectional view of the first exemplary semiconductor structure along the vertical plane B-B' of FIG. 5A.

Referring to FIGS. 5A and 5B, the epitaxial semiconductor pillar structure 46' can be optionally recessed to optimize the height of a top surface of an epitaxial semiconductor strap structure to be subsequently formed. The recessing of the epitaxial semiconductor pillar structure 46' can be performed by a recess etch. The recess etch can be an anisotropic etch or an isotropic etch, and can be selective to the dielectric material of the top portion of the at least one pad layer (62L, 64L), i.e., selective to the upper pad layer 64L. In one embodiment, a recessed top surface of the epitaxial semiconductor pillar structure 46' can be between the topmost surface of the at least one pad layer (62L, 64L) and the bottommost surface of the at least one pad layer (62L, 64L). Optionally, chemical mechanical planarization (CMP) may be employed in conjunction with, or without performing, a recess etch to adjust the height of the top surface of the epitaxial semiconductor pillar structure 46'.

Figure 6A:
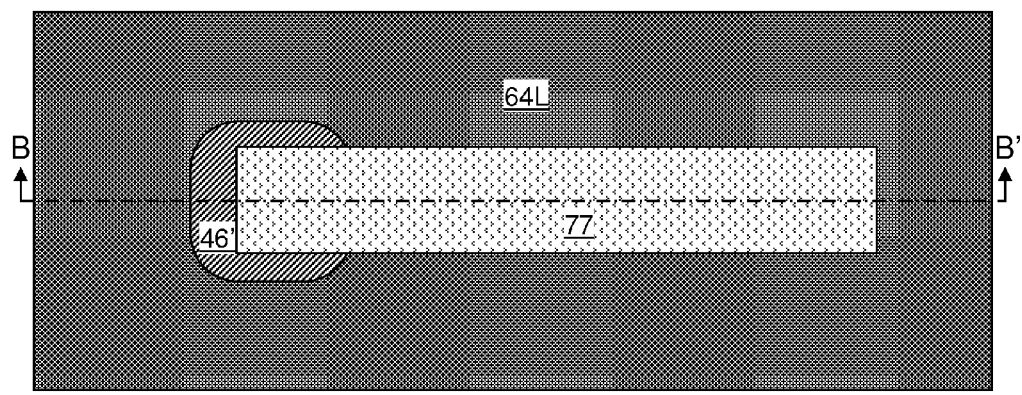
FIG. 6A is a top-down view of the first exemplary semiconductor structure after formation of a patterned photoresist layer according to an embodiment of the present disclosure.
Figure 6B:
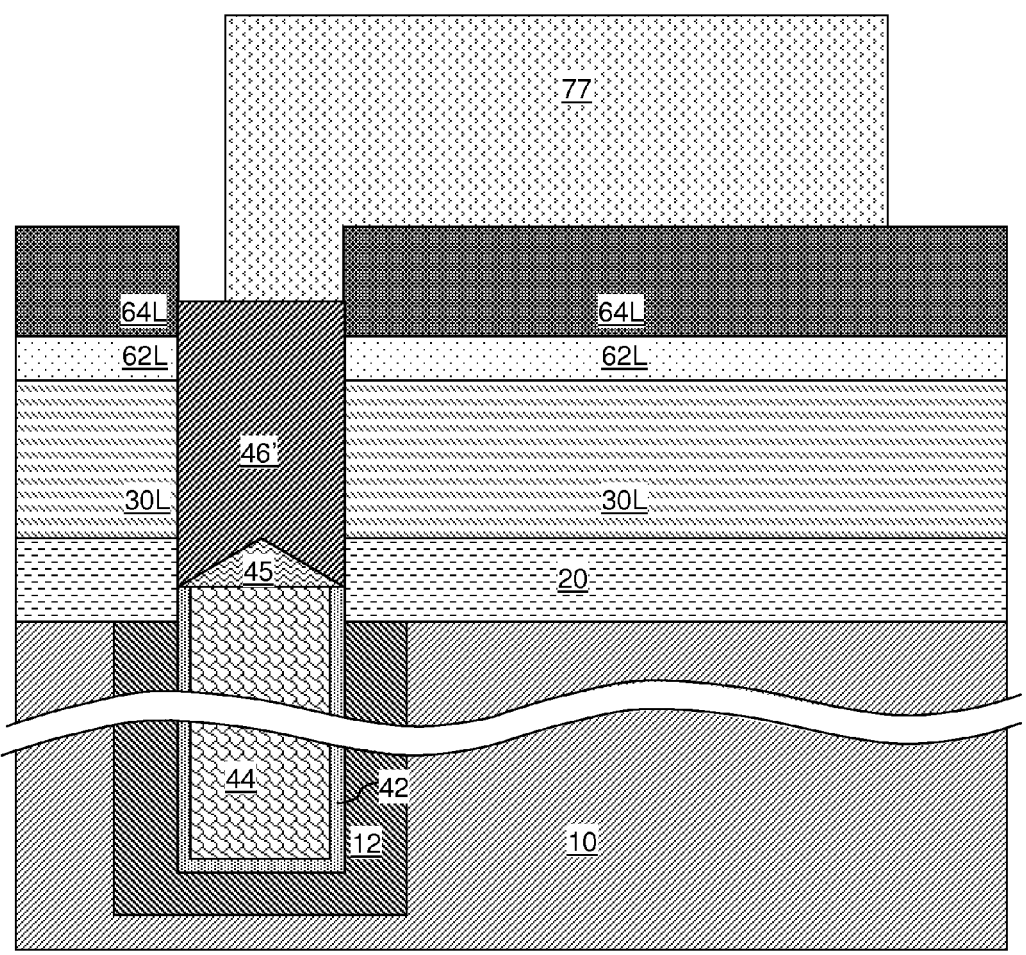
FIG. 6B is a vertical cross-sectional view of the first exemplary semiconductor structure along the vertical plane B-B' of FIG. 6A.

Referring to FIGS. 6A and 6B, a photoresist layer 77 is applied over the at least one pad layer (62L, 64L) and the epitaxial semiconductor pillar structure 46', and is lithographically patterned to block an area that straddles an interface between the epitaxial semiconductor pillar structure 46' and the top semiconductor layer 30L, i.e., the sidewalls of the trench. In one embodiment, a horizontal cross-sectional shape of the patterned photoresist layer 77 can be a polygon having a parallel pair of lengthwise edges. As used herein, a "lengthwise" edge of a polygon refers to any edge extending along a horizontal direction that is the same as, or is parallel to, the horizontal direction of the longest edge of the polygon. In another embodiment, a horizontal cross-sectional shape of the patterned photoresist layer 77 can be a rectangle having a parallel pair of lengthwise edges. In this case, the patterned photoresist layer 77 can have the same width that is invariant under translation along a lengthwise direction that is parallel to the lengthwise edges. Each of the parallel pair of lengthwise edges of the polygon or the rectangle can straddle an interface between the epitaxial semiconductor pillar structure 46' and the top semiconductor layer 30L.

Figure 7A:
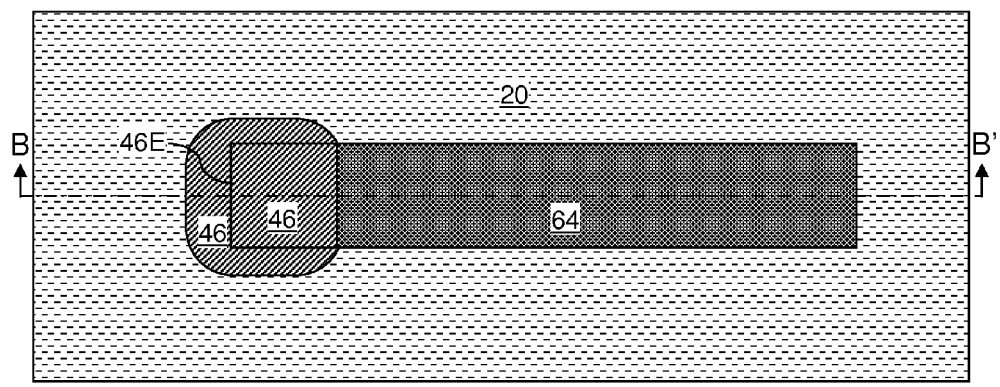
FIG. 7A is a top-down view of the first exemplary semiconductor structure after formation of an integrated fin and strap structure according to an embodiment of the present disclosure.
Figure 7B:
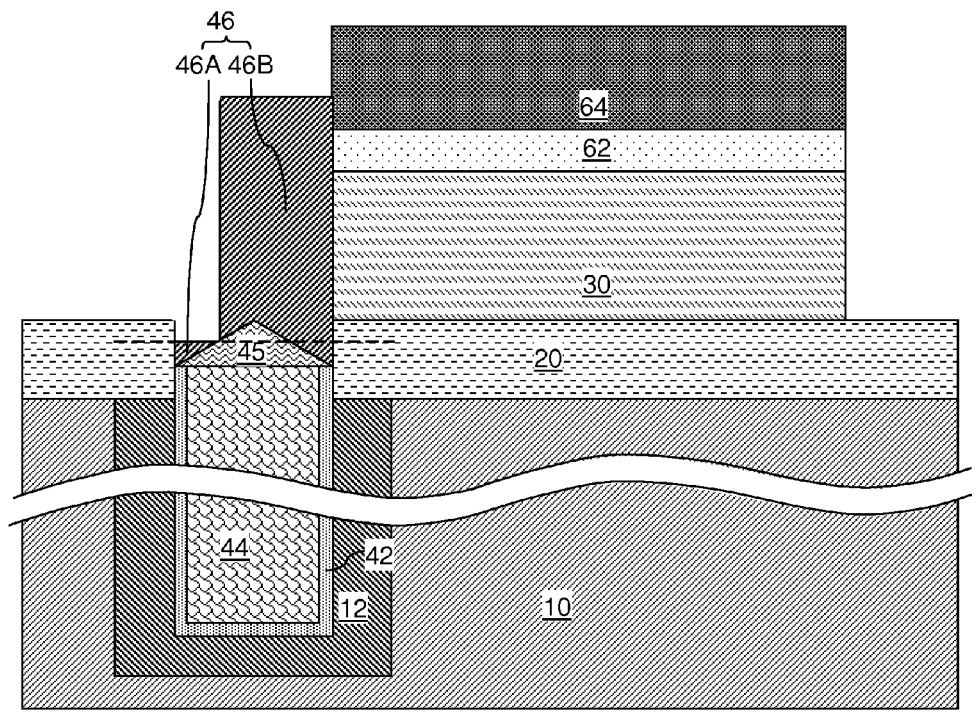
FIG. 7B is a vertical cross-sectional view of the first exemplary semiconductor structure along the vertical plane B-B' of FIG. 7A.

Referring to FIGS. 7A and 7B, the pattern in the patterned photoresist layer 77 is transferred into the top semiconductor layer 30L and an upper portion of the epitaxial semiconductor pillar structure 46' by simultaneously etching the top semiconductor layer 30L and the epitaxial semiconductor pillar structure 46'. Specifically, an integrated fin and strap structure is formed by simultaneously etching the top semiconductor layer 30L and the epitaxial semiconductor pillar structure 46' by an anisotropic etch. The anisotropic etch employs the patterned photoresist layer 77 as an etch mask. The portions of the at least one pad layer (64L, 62L) and the top semiconductor layer 30L are etched by the anisotropic etch. The anisotropic etch can employ the buried insulator layer 20 as an etch stop layer. A vertical stack of a semiconductor fin 30, a first pad portion 62, and a second pad portion 64 can be formed by remaining portions of the at least one pad layer (64L, 62L) and the top semiconductor layer 30L.

The portion of the epitaxial semiconductor pillar structure 46' that is covered with the photoresist layer 77 is not recessed during the anisotropic etch. The portion of the epitaxial semiconductor pillar structure 46' that is not covered by the photoresist layer 77 is vertically recessed. The recessed surface of the epitaxial semiconductor pillar structure 46' can be located between the top surface and the bottom surface of the buried insulator layer 20, or can be located above the top surface of the buried insulator layer 20. The remaining portion of the epitaxial semiconductor pillar structure 46' is herein referred to as an epitaxial semiconductor strap structure 46. The photoresist layer 77 can be removed after the anisotropic etch, for example, by ashing.

The epitaxial semiconductor strap structure 46 includes a lower portion 46A of the epitaxial semiconductor strap structure 46 and an upper portion 46B of the epitaxial semiconductor strap structure 46. The lower portion 46A is located below the horizontal plane including a recessed top surface of the epitaxial semiconductor strap structure 46, and the upper portion 46B is located above the horizontal plane including the recessed top surface of the epitaxial semiconductor strap structure 46. In one embodiment, the upper portion 46B of the epitaxial semiconductor strap structure 46 adjoins the lower portion 46A of the epitaxial semiconductor strap structure 46 at the horizontal plane located between the top surface of the buried insulator layer 20 and the bottom surface of the insulator layer 20. The upper portion 46B of the epitaxial semiconductor strap structure 40 protrudes above the top surface of the buried insulator layer 20.

In one embodiment, the upper portion 46B of the epitaxial semiconductor strap structure 46 and the semiconductor fin 30 can have the same width throughout. In this case, a parallel pair of sidewalls of the upper portion 46B of the epitaxial semiconductor strap structure 46 and a parallel pair of sidewalls of the semiconductor fin 30 can be within the same pair of vertical sidewalls, and can have the same width throughout.

The entirety of the epitaxial semiconductor strap structure 46 and the semiconductor fin 30 can be single crystalline. The epitaxial semiconductor strap structure 46 and the semiconductor fin 30 are collectively referred to as an integrated fin and strap structure (30, 46). The integrated fin and strap structure (30, 46) can be formed with a parallel pair of lengthwise sidewalls. An end portion of each of the parallel pair of lengthwise sidewalls of the integrated fin and strap structure (30, 46) overlies the inner electrode 44.

The first exemplary semiconductor structure of FIGS. 7A and 7B includes a trench capacitor embedded in a stack of a semiconductor substrate (i.e., the bottom semiconductor layer 10) and an insulator layer (i.e., the buried insulator layer 20). The trench capacitor includes the inner electrode 44, the node dielectric 42, and the outer electrode 12.

The integrated fin and strap structure (30, 46) is located on the buried insulator layer 20 and includes the semiconductor fin 30 and the epitaxial semiconductor strap structure 46. The epitaxial semiconductor strap structure 46 is epitaxially aligned to the semiconductor fin 30 and extends below the top surface of the buried insulator layer 20, i.e., extends below a horizontal plane including the top surface of the buried insulator layer 20.

In one embodiment, the semiconductor fin 30 and the upper portion 46B of the epitaxial semiconductor strap structure 46 have a same width throughout, which is herein referred to as a fin width. Each sidewall of the epitaxial semiconductor strap structure 46 that defines the lateral extent of the lower portion 46A of the epitaxial semiconductor strap structure 46 is vertically coincident with an outer sidewall of the node dielectric 42. In one embodiment, all sidewalls of the lower portion 46A of the epitaxial semiconductor strap structure 46 contact sidewalls of the buried insulator layer 20.

A vertical end wall 46E of the epitaxial semiconductor strap structure 46 can be perpendicular to the parallel pair of sidewalls of the semiconductor fin 30. The entirety of the vertical end wall of the epitaxial semiconductor strap structure 46 can overlie the inner electrode 44. A vertical interface between the semiconductor fin 30 and the epitaxial semiconductor strap structure 46 can be vertically coincident with an interface between the node dielectric 42 and the outer electrode 12. As used herein, a first surface and a second surface are vertically coincident with each other if a vertical surface exists from which the first surface and the second surface do not device by more than the sum of the surface roughness of the first surface and the surface roughness of the second surface.

In one embodiment, a planar topmost surface of the epitaxial semiconductor strap structure 46 can be located above a horizontal plane including the top surface of the semiconductor fin 30.

Figure 8A:
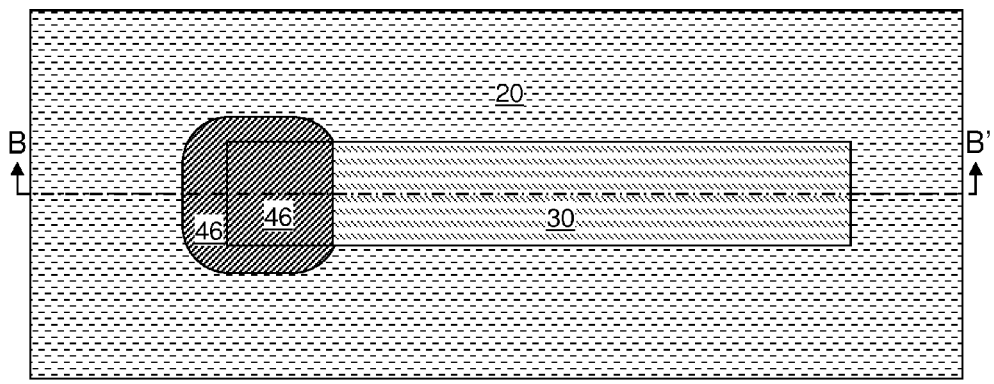
FIG. 8A is a top-down view of the first exemplary semiconductor structure after removal of at least one pad portions according to an embodiment of the present disclosure.
Figure 8B:
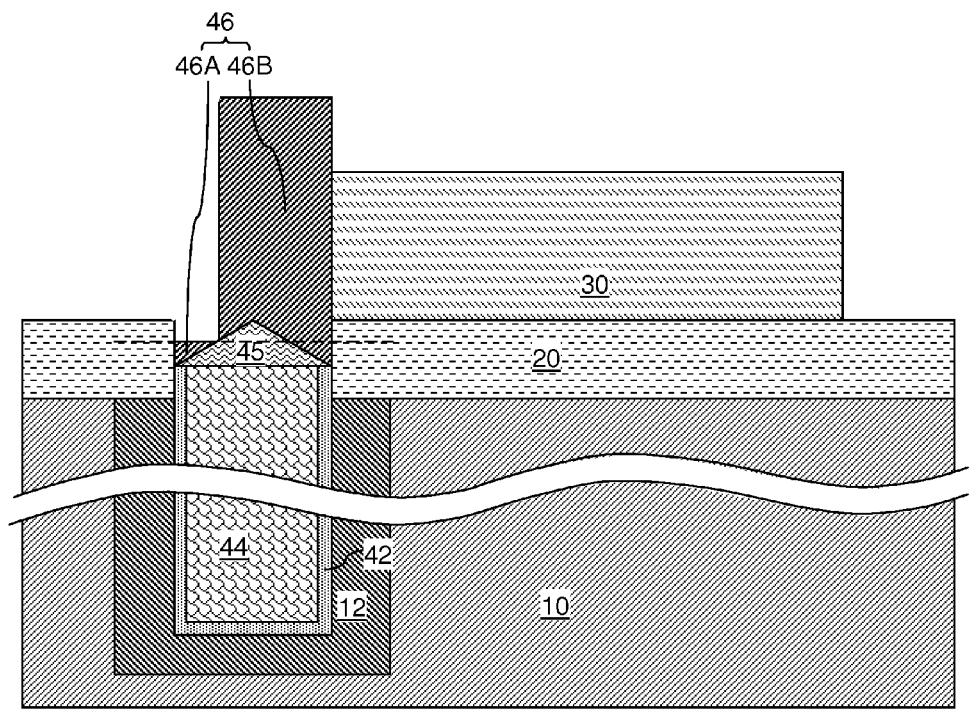
FIG. 8B is a vertical cross-sectional view of the first exemplary semiconductor structure along the vertical plane B-B' of FIG. 8A.

Referring to FIGS. 8A and 8B, the second pad portion 64 and the first pad portion 62 can be removed by an etch that is selective to the semiconductor materials of the semiconductor fin 30 and the epitaxial semiconductor strap structure 46. For example, if the second pad portion 64 includes silicon nitride and the first pad portion 62 includes silicon oxide, a wet etch employing hot phosphoric acid can be utilized to etch the second pad portion 64 and a wet etch employing hydrofluoric acid can be utilized to etch the first pad portion 62.

Figure 9A:
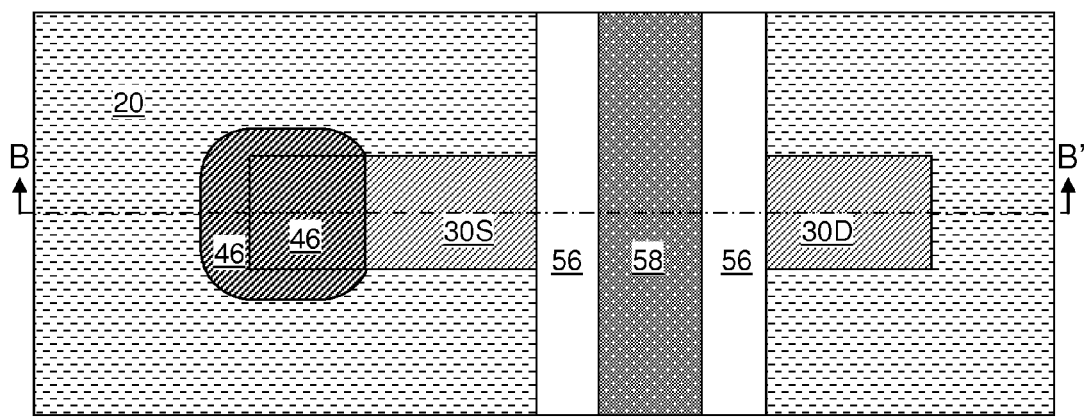
FIG. 9A is a top-down view of the first exemplary semiconductor structure after formation of a gate stack structure and a gate spacer according to an embodiment of the present disclosure.
Figure 9B:
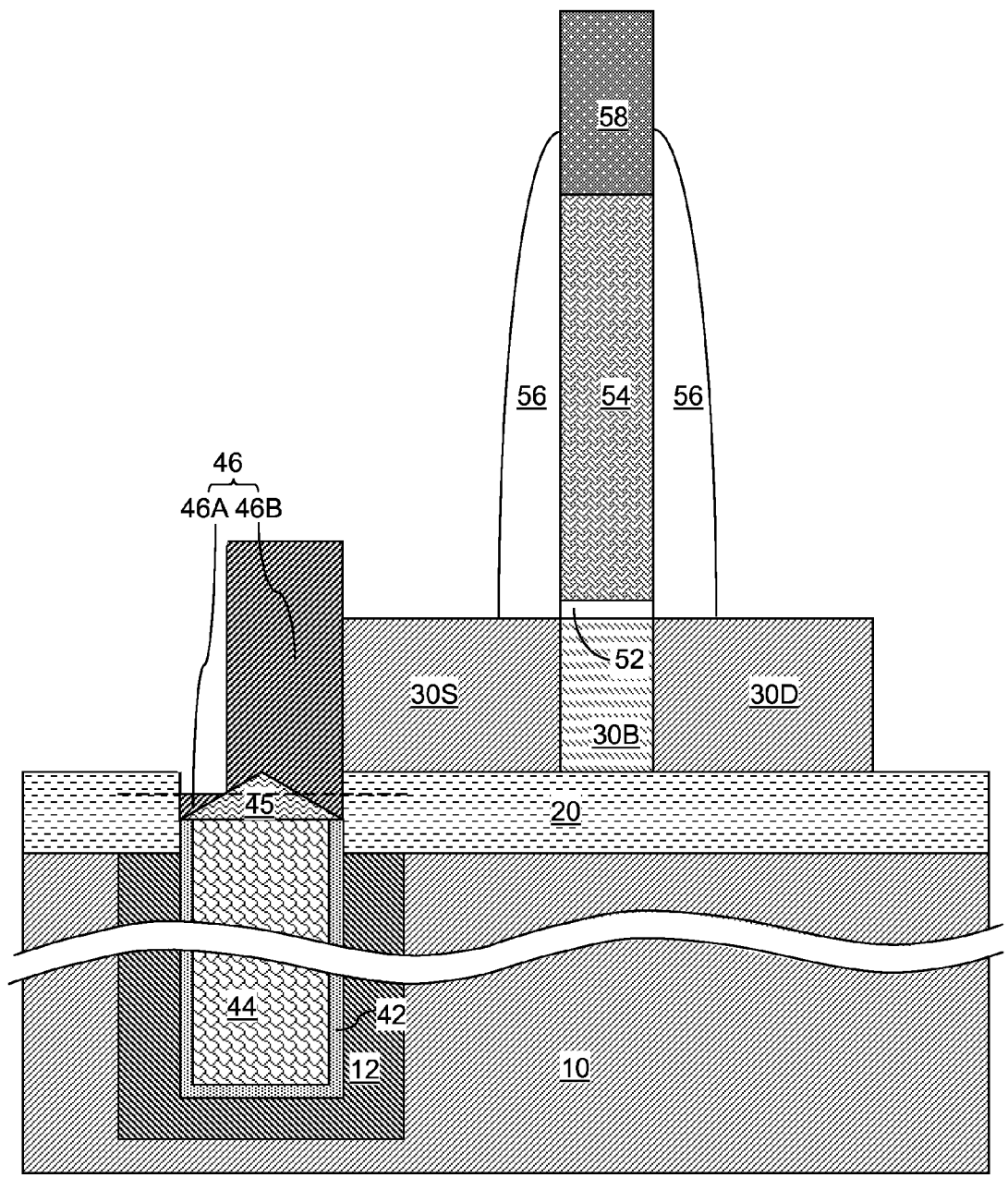
FIG. 9B is a vertical cross-sectional view of the first exemplary semiconductor structure along the vertical plane B-B' of FIG. 9A.

Referring to FIGS. 9A and 9B, a fin field effect transistor can be formed on the semiconductor fin 30. The fin field effect transistor can be employed as an access transistor of the trench capacitor (44, 42, 12) that controls flow of electrical charges into, and out of, the inner electrode 44.

Specifically, a stack of a gate dielectric layer, a gate conductor layer, and a gate cap dielectric layer is formed over the semiconductor fin 30 and the epitaxial semiconductor strap structure 46. A photoresist layer is applied over the stack, and is lithographically patterned to block an area that straddles a middle portion of the semiconductor fin 30. The pattern in the photoresist layer is transferred into the stack of the gate dielectric layer, the gate conductor layer, and the gate cap dielectric layer by at least one anisotropic etch. A remaining portion of the gate cap dielectric layer constitutes a gate cap dielectric 58, a remaining portion of the gate conductor layer constitutes a gate electrode 54, and a remaining portion of the gate dielectric layer constitutes a gate dielectric 52. The stack of the gate dielectric 52, the gate electrode 54, and the gate cap dielectric 58 collectively constitutes a gate stack structure (52, 54, 58), which straddles a middle portion of the semiconductor fin 30.

A gate spacer 56 including a dielectric material can be formed around the gate stack structure (52, 54, 58), for example, by deposition of a conformal dielectric material layer and a subsequent anisotropic etch that removes horizontal portions of the conformal dielectric material layer. The remaining vertical portions of the conformal dielectric material layer constitute the gate spacer 56.

Electrical dopants can be implanted into portions of the semiconductor fin 30 that are not blocked by the gate stack structure (52, 54, 58), for example, by ion implantation or by plasma doping or by selective deposition of an in-situ doped epitaxial semiconductor material. The implanted portions of the semiconductor fin 30 constitute a source region 30S and a drain region 30D. The portion of the semiconductor fin 30 that is not implanted with the electrical dopants constitute a body region 30B, which can be intrinsic or have a doping of the opposite conductivity type as the source region 30S and the drain region 30D.

If the epitaxial semiconductor strap structure 46 and the polycrystalline semiconductor material portion 45 are not doped prior to the processing steps of FIGS. 9A and 9B, the electrical dopants can be implanted into the epitaxial semiconductor strap structure 46 and the polycrystalline semiconductor material portion 45. If the epitaxial semiconductor strap structure 46 and the polycrystalline semiconductor material portion 45 are doped prior to the processing steps of FIGS. 9A and 9B, additional electrical dopants of the same conductivity type as preexisting electrical dopants can be introduced into the epitaxial semiconductor strap structure 46 and the polycrystalline semiconductor material portion 45.

Figure 10:
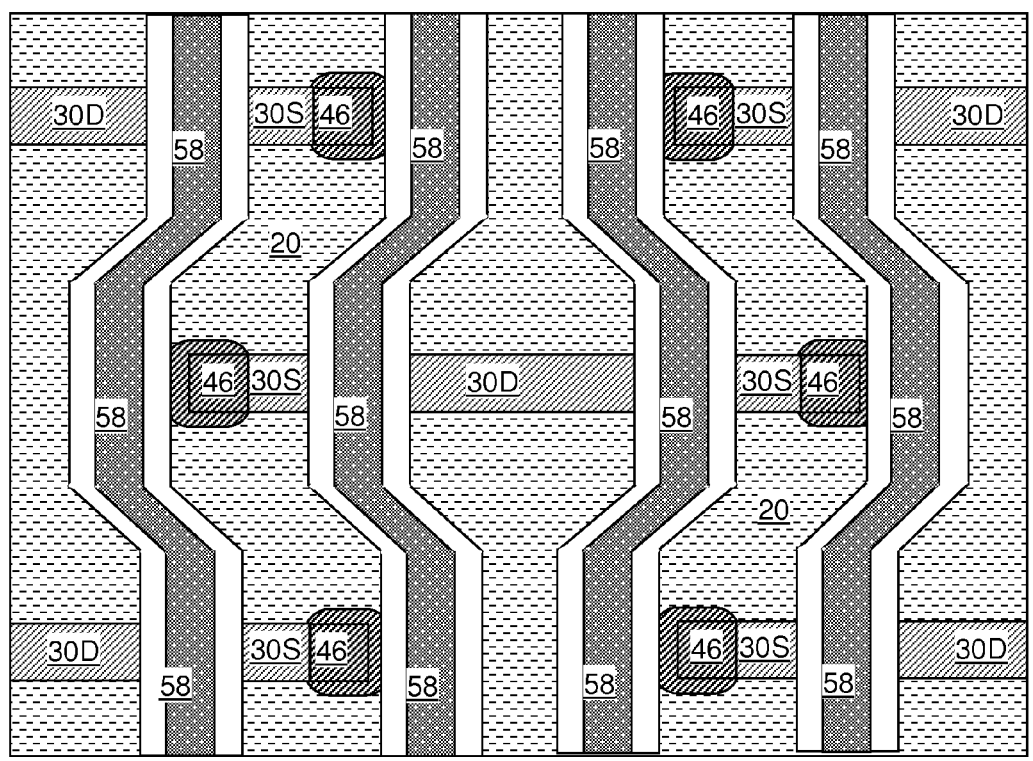
FIG. 10 is a top-down view of a second exemplary semiconductor structure after formation of gate lines and gate spacers according to an embodiment of the present disclosure.

Referring to FIG. 10, a top-down view of a second exemplary semiconductor structure illustrates implementation of the first exemplary semiconductor structure in an array environment. Two instances of the first exemplary semiconductor structure can be paired such that two drain regions 30D are integrated into a single drain region 30D, and a single semiconductor fin adjoins two epitaxial semiconductor strap structures 46 protruding into trenches below the plane including the top surface of the buried insulator layer 20. A unit structure including a semiconductor fin containing two source regions 30S and a drain region 30D, two gate stack structure (52, 54, 58), two epitaxial semiconductor strap structures 46, and two trench capacitors (44, 42, 12) are repeated within a two-dimensional array. A lateral offset is introduced in the two-dimensional array such that each neighboring unit structure along the widthwise direction of the semiconductor fins is offset by half the length of the unit structure along the lengthwise direction. Gate stack structures (52, 54, 58) from neighboring unit structures are connected to one another to form gate lines, which include active gate line portions that straddle a semiconductor fin (30S, 30B, 30D) and passing gate line portions that contact the top surface of the buried insulator layer 20.

Figure 11A:
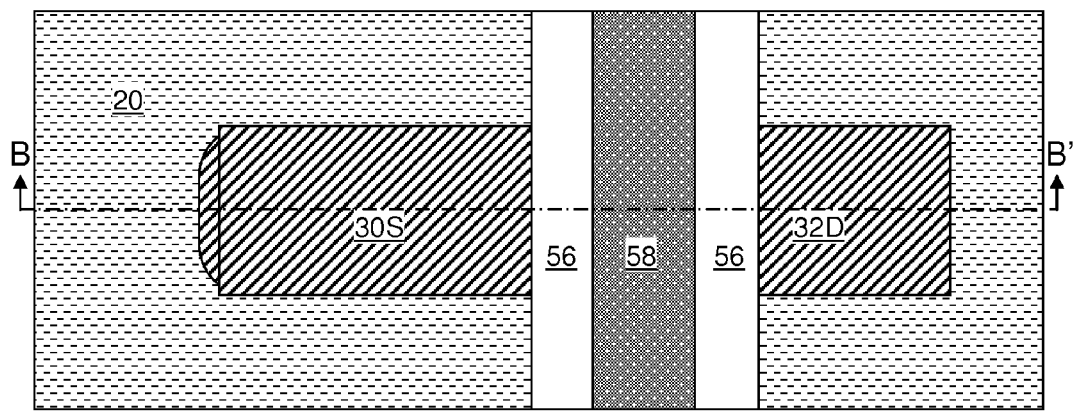
FIG. 11A is a top-down view of a third exemplary semiconductor structure after formation of a raised source region and a raised drain region by selective deposition according to an embodiment of the present disclosure.
Figure 11B:
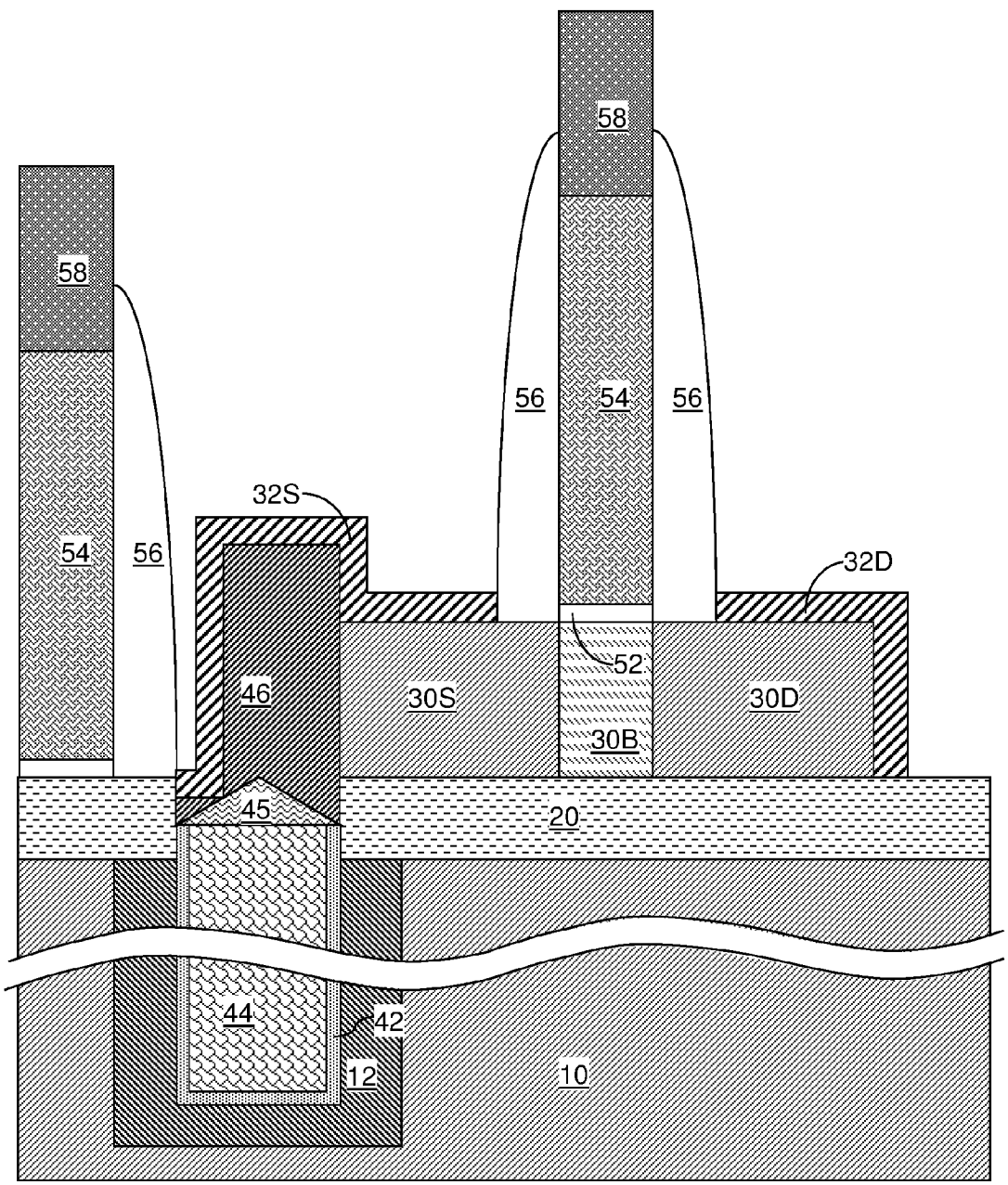
FIG. 11B is a vertical cross-sectional view of the first exemplary semiconductor structure along the vertical plane B-B' of FIG. 11A.

Referring to FIGS. 11A and 11B, a third exemplary semiconductor structure can be derived from the first exemplary semiconductor structure or the second exemplary semiconductor structure by forming a raised source region 32S and a raised drain region 32D on each source region 30S and on each drain region 30D, respectively. The raised source region 32S and the raised drain region 32D can be formed, for example, by a selective deposition process, which deposits a semiconductor material on semiconductor surfaces and does not deposit the semiconductor material on dielectric surfaces. The selective deposition process can be, for example, selective epitaxy. In this case, the entirety of the raised source region 32S, the raised drain region 32D, the semiconductor fin (30S, 30D, 30B), and the epitaxial semiconductor strap structure 46 can be single crystalline with epitaxial alignment throughout. The raised source region 32S and the raised drain region 32D have a doping of the same conductivity type as the source region 30S and the drain region 30D.

In one embodiment, the raised source region 32S and the raised drain region 32D can be formed with in-situ doping. In one embodiment, a thermal anneal can be employed to diffuse electrical dopants from the raised source region 32S and the raised drain region 32D into the source region 30S and the drain region 30D, or from the source region 30S and the drain region 30D into the raised source region 32S and the raised drain region 32D. In one embodiment, the raised source region 32S and the raised drain region 32D can be formed without in-situ doping, i.e., as intrinsic semiconductor material portions, and can be subsequently doped by ion implantation and/or outdiffusion of dopants from the source region 30S and the drain region 30D during an anneal at an elevated temperature. Optionally, the electrical dopants introduced into the raised source region 32S and the raised drain region 32D by in-situ doping or by implantation may diffuse into the source region 30S and the drain region 32D during an anneal at an elevated temperature.

Figure 12:
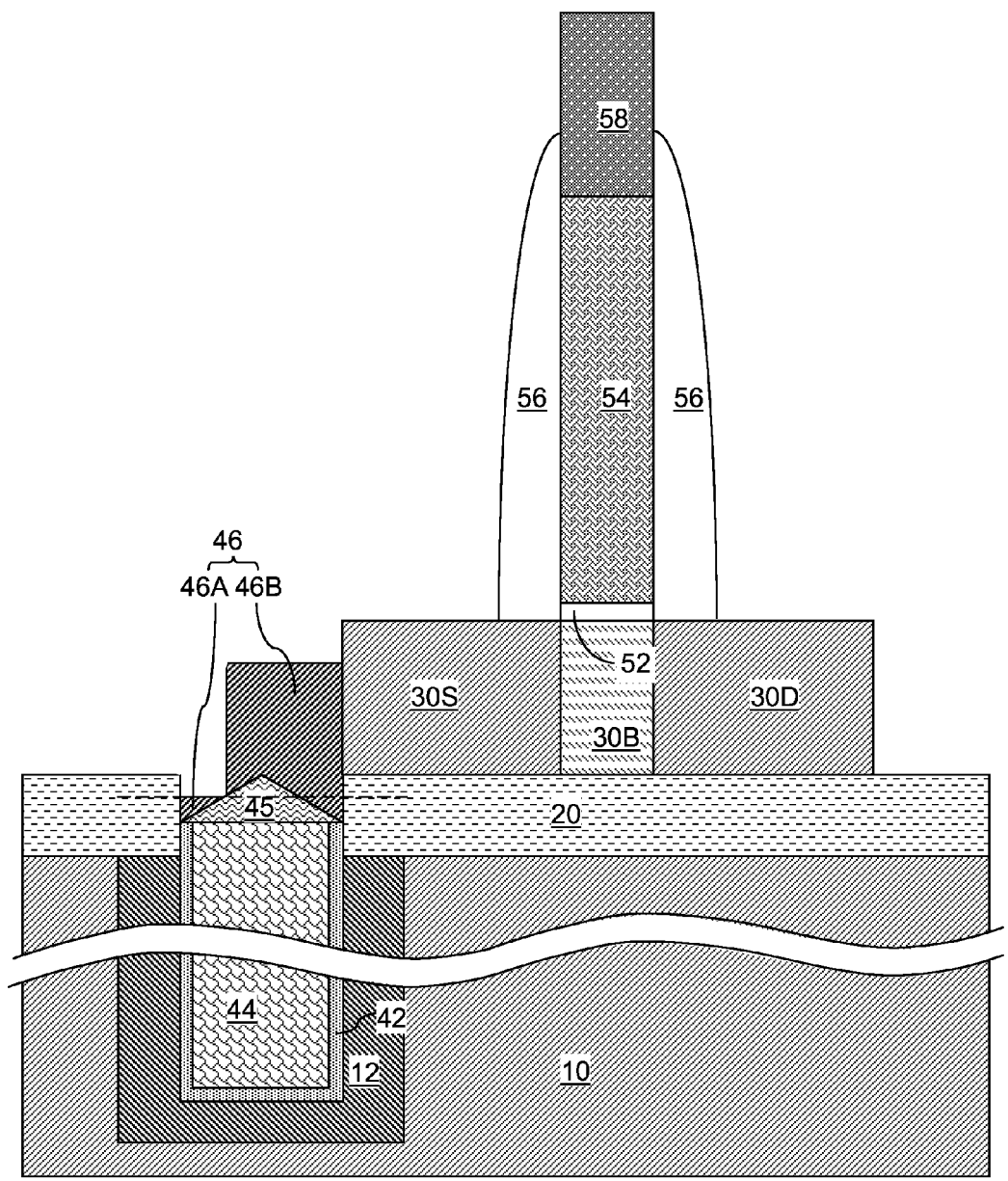
FIG. 12 is a vertical cross-sectional view of a fourth exemplary semiconductor structure after formation of a gate stack structure and a gate spacer according to an embodiment of the present disclosure.

Referring to FIG. 12, a fourth exemplary semiconductor can be derived from the first, second, or third exemplary semiconductor structures by altering the recess process illustrated in FIGS. 5A and 5B, and/or by altering the anisotropic etch process illustrated in FIGS. 7A and 7B. A planar topmost surface of the epitaxial semiconductor strap structure 46 is formed below the horizontal plane including the top surface of the semiconductor fin 30.

Figure 13:
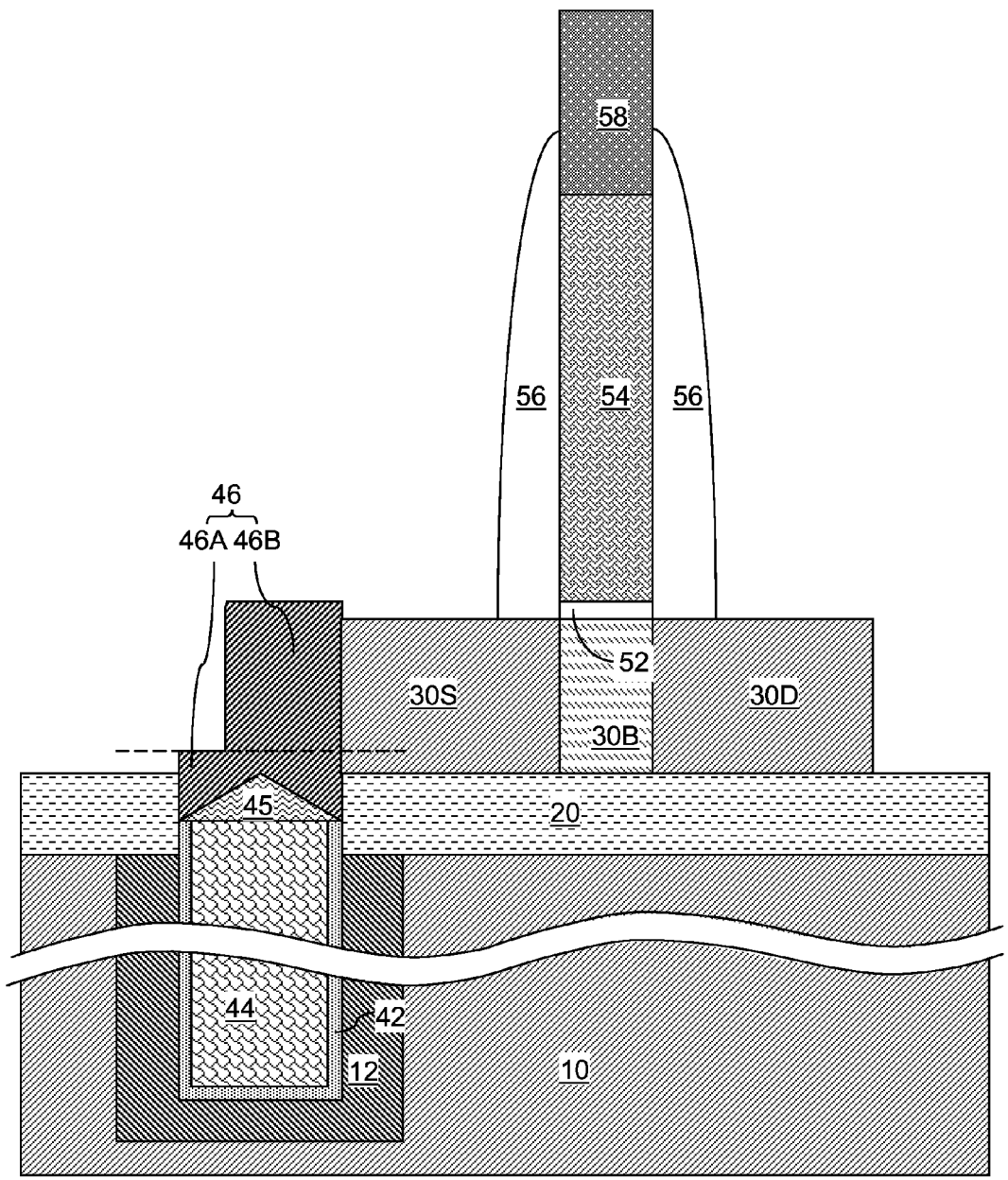
FIG. 13 is a vertical cross-sectional view of a fifth exemplary semiconductor structure after formation of a gate stack structure and a gate spacer according to an embodiment of the present disclosure.

Referring to FIG. 13, a fifth exemplary semiconductor can be derived from the first, second, or third exemplary semiconductor structures by altering or omitting the recess process illustrated in FIGS. 5A and 5B, and/or by altering the anisotropic etch process illustrated in FIGS. 7A and 7B. The recessed top surface of the epitaxial semiconductor strap structure 46 is located above the top surface of the buried insulator layer 20 and below the top surface of the semiconductor fin (30S, 30D, 30B). The lower portion 46A of the epitaxial semiconductor strap structure 46 contacts a sidewall of the buried insulator layer 20 and protrudes above the top surface of the buried insulator layer 20. The entirety of the upper portion 46B of the epitaxial semiconductor strap structure 40 protrudes above the top surface of the buried insulator layer 20. The upper portion 46B of the epitaxial semiconductor strap structure 46 adjoins the lower portion 46A of the epitaxial semiconductor strap structure 46 at a horizontal plane located above the top surface of the buried insulator layer 20. A planar topmost surface of the epitaxial semiconductor strap structure 46 may be formed below, at, or above the horizontal plane including the top surface of the semiconductor fin 30.

While the disclosure has been described in terms of specific embodiments, it is evident in view of the foregoing description that numerous alternatives, modifications and variations will be apparent to those skilled in the art. Each of an embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a trench capacitor embedded in a stack of a semiconductor substrate and an insulator layer and comprising an inner electrode, a node dielectric, and an outer electrode; and
an integrated fin and strap structure located on said insulator layer and comprising a semiconductor fin and an epitaxial semiconductor strap structure, wherein said epitaxial semiconductor strap structure is epitaxially aligned to said semiconductor fin and extends below a top surface of said insulator layer, wherein said epitaxial semiconductor strap structure includes a non-recessed pillar portion in direct physical contact with a sidewall surface of said semiconductor fin and having a first height, and a recessed pillar portion located under said non-recessed pillar portion and having a second height that is less than the first height, said epitaxial semiconductor strap structure is spaced apart from a topmost surface of said inner electrode by a polycrystalline semiconductor material portion, said polycrystalline semiconductor material portion has a non-uniform vertical thickness and a non-planar top surface and is present on an entirety of said topmost surface of said inner electrode.

2. The semiconductor structure of claim 1, wherein a sidewall of said epitaxial semiconductor strap structure is vertically coincident with an outer sidewall of said node dielectric.

3. The semiconductor structure of claim 1, wherein a sidewall of a lower portion of said non-recessed pillar portion of said epitaxial semiconductor strap structure contacts a sidewall of said insulator layer.

4. The semiconductor structure of claim 3, wherein an upper portion of said non-recessed pillar portion of said epitaxial semiconductor strap structure adjoins said lower portion at a horizontal plane located between a top surface of said insulator layer and a bottom surface of said insulator layer.

5. The semiconductor structure of claim 1, wherein a lower portion of said non-recessed pillar portion of said epitaxial semiconductor strap structure contacts a sidewall of said insulator layer, and an upper portion of said non-recessed pillar portion of said epitaxial semiconductor strap structure protrudes above said top surface of said insulator layer.

6. The semiconductor structure of claim 5, wherein said upper portion of said non-recessed pillar portion of said epitaxial semiconductor strap structure adjoins said lower portion of said non-recessed pillar portion of said epitaxial semiconductor strap structure at a horizontal plane located above a top surface of said insulator layer.

7. The semiconductor structure of claim 1, wherein a planar topmost surface of said non-recessed pillar portion of said epitaxial semiconductor strap structure is located above a horizontal plane including a top surface of said semiconductor fin.

8. The semiconductor structure of claim 1, wherein a planar topmost surface of said non-recessed pillar portion of said epitaxial semiconductor strap structure is located below a horizontal plane including a top surface of said semiconductor fin.

9. The semiconductor structure of claim 1, wherein said semiconductor fin and said epitaxial semiconductor strap structure comprises different semiconductor materials.

10. The semiconductor structure of claim 1, wherein a vertical end wall of said epitaxial semiconductor strap structure is perpendicular to a pair of sidewalls of said semiconductor fin.

11. The semiconductor structure of claim 10, wherein said vertical end wall of said epitaxial semiconductor strap structure overlies said inner electrode.

12. The semiconductor structure of claim 1, wherein a vertical interface between said semiconductor fin and said epitaxial semiconductor strap structure is vertically coincident with an interface between said node dielectric and said outer electrode.

13. The semiconductor structure of claim 1, wherein said polycrystalline semiconductor material portion extends onto a topmost surface of said node dielectric.

14. The semiconductor structure of claim 1, wherein said non-recessed pillar portion of said epitaxial semiconductor strap structure extends over a central portion of said inner electrode.

* * * * *